(12) United States Patent
Delamarche et al.

(10) Patent No.: US 6,770,558 B2
(45) Date of Patent: Aug. 3, 2004

(54) SELECTIVE FILLING OF ELECTRICALLY CONDUCTIVE VIAS FOR THREE DIMENSIONAL DEVICE STRUCTURES

(75) Inventors: Emmanuel Delamarche, Adliswil (CH); Michel Despont, Adliswil (CH); Ute Drechsler, Kilchberg (CH); Matthias Geissler, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/371,466

(22) Filed: Feb. 21, 2003

(65) Prior Publication Data

US 2003/0219970 A1 Nov. 27, 2003

(30) Foreign Application Priority Data

Feb. 25, 2002 (EP) .............................. 02405131

(51) Int. Cl.[7] .......................................... H01L 21/4763
(52) U.S. Cl. ........................................ 438/629; 438/675
(58) Field of Search .................................. 438/629, 675, 438/668, 672; 257/774

(56) References Cited

U.S. PATENT DOCUMENTS

| 4,956,197 | A | * | 9/1990 | Babu et al. ................... 427/536 |
| 4,969,979 | A | * | 11/1990 | Appelt et al. ................ 205/131 |
| 6,136,693 | A | * | 10/2000 | Chan et al. ................... 438/633 |
| 6,495,200 | B1 | * | 12/2002 | Chan et al. .................... 427/97 |

* cited by examiner

*Primary Examiner*—Sara Crane
(74) *Attorney, Agent, or Firm*—Louis P. Herzberg (57) ABSTRACT

Methods and apparatus for forming and/or enabling interconnection in a substrate. An example embodiment of a method comprises forming a via in the substrate. A preconditioning layer is deposited on the substrate. A catalyst layer is then bound to the preconditioning layer. A conductive material is deposited on the catalyst layer by electro-less deposition to fill the via with the conductive material. Deposition of the conductive material is selectively disabled from coating surfaces of the substrate outside the via. Advantageous alternatives are presented.

31 Claims, 7 Drawing Sheets

SELECTIVE FILLING OF ELECTRICALLY CONDUCTIVE VIAS FOR THREE DIMENSIONAL DEVICE STRUCTURES

FIELD OF THE INVENTION

The present invention generally relates to electrically conductive vias for three dimensional electronic and electromechanical device structures and particularly relates to a method for forming such vias in a substrate of such a device.

BACKGROUND OF THE INVENTION

Electrically conductive vias are usually formed in a substrate material such as a silicon wafer to permit communication of signals between electronic devices such as transistors and the like located on opposite sides of the substrate. Such vias are occasionally referred to as through-wafer interconnections. Typically, the via is formed by initially forming an aperture extending through the substrate. As indicated in P. C. Andricacos et al. *"Damascene Copper Electroplating for Chip Interconnections"* IBM J. Res. Develop. 1998, Vol. 42, 567, the aperture is then filled with an electrically conductive material such as a metal. There are a variety of conventional deposition processes for filling an aperture with metal. Examples of such processes include the evaporation or sputtering of metal in vacuum, chemical vapor deposition (CVD), electroplating, or electroless deposition (ELD).

Evaporation or sputtering of metal in vacuum is a relatively simple technique involving placement of the substrate containing the apertures in a vacuum chamber. The entire surface of the substrate is then covered with a metal evaporated or sputtered from a source. Selective deposition of metal to selected areas of the substrate can be achieved by placing a mask between the source and the substrate. Such techniques are sometimes referred to as shadowed metallization. In an alternative technique, the mask is replaced by a patterned layer of resist covering the substrate save for the apertures to be filled. After metallization, surplus metal around the apertures is removed together with the underlying resist.

CVD also involves placing the substrate containing the apertures in a vacuum environment. In this technique, metallization is realized by decomposing a gaseous precursor compound of a metal injected inside the vacuum chamber. The gaseous compound decomposes and the metal, or an alloy thereof accumulates on the surface of the substrate. Selective metallization can be achieved through use of a gaseous precursor which reacts only with a specific material. By patterning such a material onto the substrate, deposition can be made selective.

Electroplating offers an alternative to the aforementioned techniques of metal deposition from vacuum. In electroplating, the substrate is immersed in an electroplating bath containing a metallic complex in solution. The metal content of the solution is deposited on the substrate by passing an electrical current through the substrate and the solution. It will be appreciated that the substrate should therefore be either conductive or otherwise made conductive. It will also be appreciated that the substrate should be compatible with the various chemicals forming the electroplating bath. In the event that the substrate is not electrically conductive, electroplating can be performed by initially applying a conductive layer by vacuum deposition for example. A resist patterned onto the surface of the substrate to be electroplated can localize metal deposition from solution to desired areas of the substrate. Electroplating can be performed at higher rates of deposition through use of a higher current density on the substrate. Electroplating can also be expedited by stirring the electroplating bath.

ELD is a similar process to that of electroplating. However, as indicated in G. O. Mallory, J. B. Haidu *"Electroless Plating: Fundamentals and Applications"* American Electroplaters and Surface Finishers Society, Orlando, Fla., USA, 1990, the substrate need not be conductive for ELD to work. In ELD, the surface of the substrate is immersed in a bath containing a metallic complex in solution. The metallic complex is reduced and deposited from the solution to the surface of the substrate as chemical species in the solution oxidize. It is not necessary to pass a current through the system. It will be appreciated then that ELD is attractive for covering insulating substrates with metals or alloys. ELD is promoted by placing a catalyst on the substrate to start or "seed" the deposition reaction. The reaction then typically continues in an autocatalytic manner. A patterned resist may be employed to keep the ELD of a metal localized to specific areas of the substrate.

Metal CVD is a relatively expensive process because it has a limited throughput and requires relatively complex and expensive equipment such as a vacuum chamber, pumps, valves. Additionally, metal CVD is unreliable at low temperatures, below 350 degrees centigrade, for example. Thus, metal CVD may be unsuitable for metallizing some heat-sensitive substrates. Furthermore, metal CVD exhibits a relatively slow deposition rate and is therefore unsuitable for filling vias having a diameter of the order of tens of micrometers.

Vacuum sputtering and deposition has similar disadvantages, again requiring relatively expensive equipment, and having limited deposition rates. Vacuum deposition involves pumping delays, thereby limiting throughput. Also, if the apertures are too narrow, they may be very difficult to fill with metal because of the shadowing effect of the walls of the apertures. Metal deposition from solution is suited to the filling of apertures with metals because such techniques are generally cheaper and faster. However, electroplating is not suited to all applications because, as indicated earlier, it requires at least a conductive layer on the substrate to start the electroplating process. This conductive or "seed" layer is typically deposited with one of the aforementioned techniques and thus introduces the associated disadvantages.

Filling vias with metal through ELD is difficult because the metal should be deposited relatively thickly so that vias are properly filled. However, relatively thick metal layers deposited by ELD tend to have relatively high internal mechanical stress and poor adhesion to the substrate. It is difficult to keep the metal deposited via ELD localized to the vias. Conventionally, the ELD catalyst is placed from solution onto the entire surface of the substrate. ELD then takes place everywhere both inside and outside the vias. Polishing of the substrate after deposition is then performed to remove surplus metal depositions. Post-deposition cleaning steps such as polishing are unsuitable for use in the fabrication of devices in which delicate microstructures are present because such structures are susceptible to damage by such actions. Coating the substrate with the ELD catalyst and then masking the catalyst outside the vias using a patterned resist is relatively expensive and difficult. Spin coating a resist onto the substrate having deep structures is also relatively difficult and requires relatively expensive equipment for performing the spin coating, alignment, exposure, development, and removal of the exposed resist.

Accordingly, it would be desirable to fill vias in a substrate with conductive material such as metal or alloy with better filling selectivity, at lower cost, and without demand for post-cleaning.

SUMMARY OF THE INVENTION

Thus, the present invention provides methods and apparatus for forming an interconnection in a substrate. An example embodiment of the method comprising: forming a via in the substrate; depositing a preconditioning layer on the substrate binding a catalyst layer to the preconditioning layer; depositing a conductive material on the catalyst layer by electro-less deposition to fill the via with the conductive material; and, selectively disabling deposition of the conductive material from coating surfaces of the substrate outside the via.

In advantageous embodiments of the present invention, an isolation layer is formed on the substrate prior to deposition of the preconditioning layer. The isolation preferably comprises an oxide of the substrate. Particularly advantageous embodiments of the present invention comprise hydrophilizing the substrate prior to deposition of the preconditioning layer.

In particularly advantageous embodiments of the present invention, the selective disabling comprises immersing the substrate in a processing solution and employing surface tension to prevent ingress of a processing solution into the via. The processing solution preferably comprises an aqueous solution. The aqueous solution may comprise an alkaline solution. Alternatively, the aqueous solution may comprise an oxidizing agent.

In an advantageous embodiment of the present invention, there is provided a method for selectively filling vias formed in a substrate. The filling of the vias is effected through electroless deposition of a metal or alloy without depositing excess of material outside the vias, thereby avoiding subsequent polishing steps necessary to remove surplus material outside the vias.

In an advantageous embodiment, vias in a substrate are filled by grafting from solution a relatively thin, homogeneous organic layer on the interior walls of the via and other surfaces of the substrate. The organic layer is then selectively removed from the surface of the substrate, but not from the interior of the vias. The removal is performed by plasma sputtering. Catalytic particles are then bound from solution to the residual organic layer remaining in the vias. The catalytic particles initiate the ELD of a metal inside the vias.

BRIEF DESCRIPTION OF THE DRAWINGS

Advantageous embodiments of the present invention, will now be described, by way of example only, with reference to the accompanying drawings, in which.

DETAILED DESCRIPTION OF THE INVENTION

In accordance with the present invention, there is now provided methods and apparatus for forming an interconnection in a substrate. An example embodiment of a method comprises: forming a via in the substrate; depositing a preconditioning layer on the substrate; binding a catalyst layer to the preconditioning layer; depositing a conductive material on the catalyst layer by electro-less deposition to fill the via with the conductive material; and, selectively disabling deposition of the conductive material from coating surfaces of the substrate outside the via.

The selective disabling may comprise selectively removing the preconditioning layer from surfaces of the substrate outside the via prior to binding of the catalyst layer. Such selective removing may comprise selectively etching the preconditioning layer. Alternatively, the selective disabling may comprise selectively removing the preconditioning layer and the catalyst layer from surfaces of the substrate outside the via prior to deposition of the conductive material. Such selective removing comprises selectively etching the catalyst layer and the preconditioning layer.

The selective etching may comprise plasma etching in a gas environment. The plasma etching advantageously comprises controlling depth of penetration of a plasma into the via based on the pressure of the gas environment. The gas is preferably Argon. In an advantageous embodiment of the present invention, the pressure of the gas environment is in the range of about 50 to 100 milliTorr.

The selective disabling may alternatively comprise selectively depositing a passivation layer on the preconditioning layer coating surfaces of the substrate outside the via to prevent the catalyst layer from binding to preconditioning layer coating surfaces of the substrate outside the via.

Alternatively, the selective disabling comprises: depositing an initiating layer of the conductive material on the catalyst layer; and selectively removing the preconditioning layer, the catalyst layer, and the initiating layer from surfaces of the substrate outside the via prior to deposition of the conductive material. The selectively removing advantageously comprises selectively etching the initiating layer, the catalyst layer, and the preconditioning layer.

In advantageous embodiments of the present invention, an isolation layer is formed on the substrate prior to deposition of the preconditioning layer. The isolation advantageously comprises an oxide of the substrate. Particularly advantageous embodiments of the present invention comprise hydrophilizing the substrate prior to deposition of the preconditioning layer. The depositing of the preconditioning layer may then comprise immersing the substrate in a grafting solution of material for forming the catalyst layer. The depositing of the preconditioning layer advantageously comprises applying ultrasound to the grafting solution. Similarly, the binding of the catalyst layer may comprise immersing the substrate in an acidic solution of material for forming the catalyst layer. The binding of the catalyst layer comprises applying ultrasound to the acidic solution.

In particularly advantageous embodiments of the present invention, the selective disabling comprises immersing the substrate in a processing solution and employing surface tension to prevent ingress of a processing solution into the via. The processing solution advantageously comprises an aqueous solution. The aqueous solution may comprise an alkaline solution. Alternatively, the aqueous solution may comprise an oxidizing agent. The immersing of the substrate in the processing solution may be performed after deposition of the preconditioning layer. Alternatively, the immersing of the substrate in the processing solution is performed after deposition of the catalyst layer.

In an advantageous embodiment of the present invention, there is provided a method for selectively filling vias formed in a substrate. The filling of the vias is effected through electroless deposition of a metal or alloy without depositing excess of material outside the vias, thereby avoiding subsequent polishing steps necessary to remove surplus material outside the vias. The method is cheaper, simpler, and provides a higher yield than conventional filling methods, even for higher density arrays of vias. The method is therefore attractive for microelectronics applications and for microelectrochemical systems applications. In both of these applications, there is a trend towards increasing via densities. Because the method does not require polishing to remove surplus of deposited material, it is especially attractive for introducing electrical interconnections to delicate microstructures such as those including tip protrusions. An example of such a microstructure is described by P. Vettiger et al. *"The "Millipede"—More than one thousand Tips for Future AFM Data Storage" IBM J. Res. Develop.* 2000, Vol. 44, 323. Methods embodying the present invention are equally applicable however to forming electrical interconnections in other three dimensional devices, such as three dimensional memory stacks and processor arrays for example.

In an advantageous embodiment of the present invention to be described shortly, vias in a substrate are filled by grafting from solution a relatively thin, homogeneous organic layer on the interior walls of the via and other surfaces of the substrate. The organic layer is then selectively removed from the surface of the substrate, but not from the interior of the vias. The removal is performed by plasma sputtering. Catalytic particles are then bound from solution to the residual organic layer remaining in the vias. The catalytic particles initiate the ELD of a metal inside the vias.

In the fabrication of MEMS devices involving CMOS circuitry, it is desirable from interconnections at a relatively low temperature of less than 400 degrees centigrade, and advantageously no more than 350 degrees centigrade, in the interest of avoiding thermal damage to the CMOS circuitry, the MEMS features, or both. Where possible, it is desirable to avoid lithography steps because resist-based processing over relatively deep features is difficult to perform. It is desirable to obtain a good deposition within relatively high aspect ratio structures. Additionally, it is desirable to minimize processing costs.

As mentioned earlier, metal deposition can be performed using CVD, electroplating or ELD. However, CVD of metal is relatively slow, relatively expensive and unreliable at temperatures lower than 350 degrees centigrade. Electroplating requires preparatory deposition of a seed layer. The seed layer can be laid down by CVD or ELD. Over-plating is difficult to prevent, however. Therefore, polishing is needed to remove surplus metal deposits.

A advantageous embodiment of the present invention will now be described in detail with reference to FIG. 1 where the general process flow is illustrated.

Figure 1A:
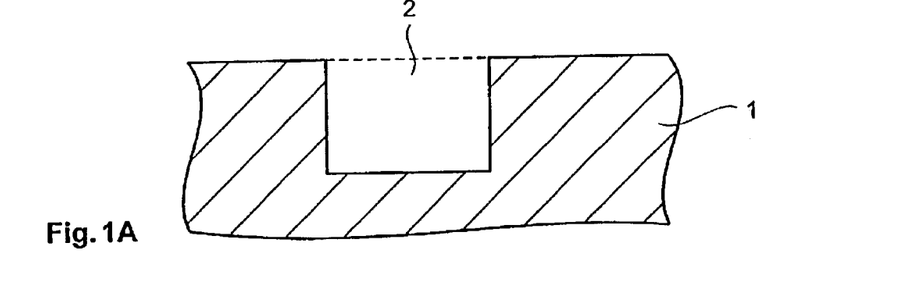
FIG. 1A is an example of a cross-sectional view of a closed via formed in a substrate.

Referring first to FIG. 1A, a via 2 is formed in a substrate 1 in the form of a silicon wafer. It will be appreciated that the present invention may be applied to substrates formed from other insulating or semi-conducting materials, depending on application. In a particularly advantageous embodiment of the invention, the via 2 is created in the substrate 1 by deep reactive ion etching (DRIE). An advantage of DRIE is that it is particularly useful for forming vias with relatively high aspect ratios (up to 20, for example). In order to provide a relatively high density of interconnections in an array, it is desirable to keep the diameter of vias as small as possible. Typical diameters of a via can range from 10 to 50 micrometers.

Figure 1B:
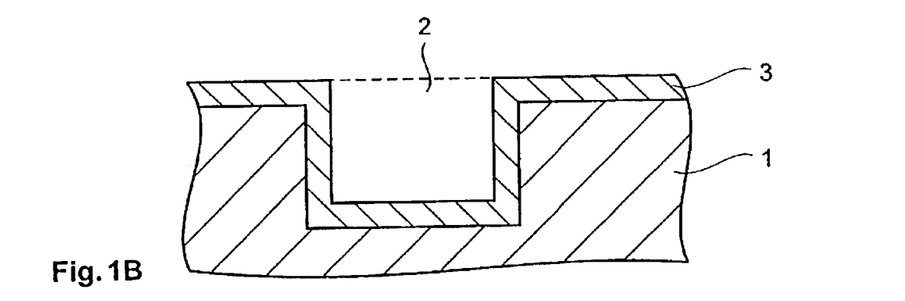
FIG. 1B is an example of a cross-sectional view of the closed via with an isolating layer covering both the substrate and the via.

Turning to FIG. 1B, an isolation layer 3 is formed on the surface of the substrate 1. The isolation layer 3 is preferably formed via a technique permitting a conformable and homogeneous coating of the substrate 1. Thermal oxidization, for example, is one such method. By thermal oxidation, the isolating layer 3, in the form of an oxide layer, can be disposed on the surface of silicon. Different techniques such as chemical vapor deposition (CVD) and plasma enhancement chemical vapor deposition (PECVD) may be employed for forming the isolating layer 3 on various other materials. Typically, the thickness of the isolation layer 3 ranges from 100 nanometers to 1 micrometer.

Figure 1C:
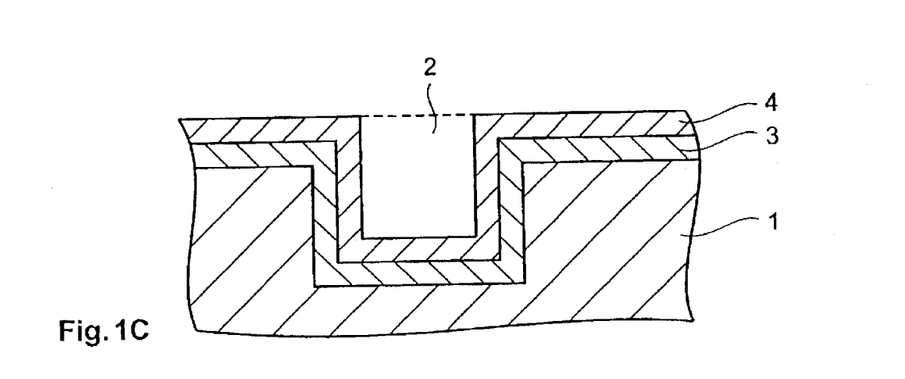
FIG. 1C is an example of a cross-sectional view of the via with a preconditioning layer covering the isolating layer.

Referring to FIG. 1C, a preconditioning layer 4 is now deposited on the surface of the substrate 1. Pretreatment of the substrate 1 is desirable for enhancing the binding of catalysts used in ELD to obtain uniform, adhesive and high-quality metal deposits on the substrate 1. The preconditioning layer 4 provides interaction with ELD catalysts for ELD to immobilize them on the surface of the substrate 1. Further details of such preconditioning can be found in S. L. Brandow et al. *"The Morphology of Electroless Ni Deposition on a Colloidal Pd(II) Catalyst" J. Electrochem. Soc.* 1995, Vol. 142, 2223. In a particularly advantageous embodiment of the present invention, the preconditioning layer 4 is applied by grafting a thin organic mono-layer onto the substrate 1. The mono-layer preferably comprises amino functionalities to provide an interaction with Pd/Sn-based colloidal catalysts. The grafting procedure can be performed by simply immersing the substrate 1 into a solution containing the molecules for forming the mono-layer. The molecules react with the surface of the substrate 1 to form a relatively dense and homogeneous preconditioning layer 4. Examples of such molecules for forming the preconditioning layer 4 on Si substrates include $NH_2$-containing trimethoxy organosilanes. These compounds are advantageous because they: react rapidly with native oxide on the surface of Si substrates; form dense and homogeneous mono-layers or multi-layers on Si substrates; and, can be easily grafted from solution. Mono-layers of these compounds on Si substrates generally provide high chemical and mechanical stability, and, most importantly, can immobilize Pd/Sn colloidal catalysts on the substrate surface.

Figure 1D:
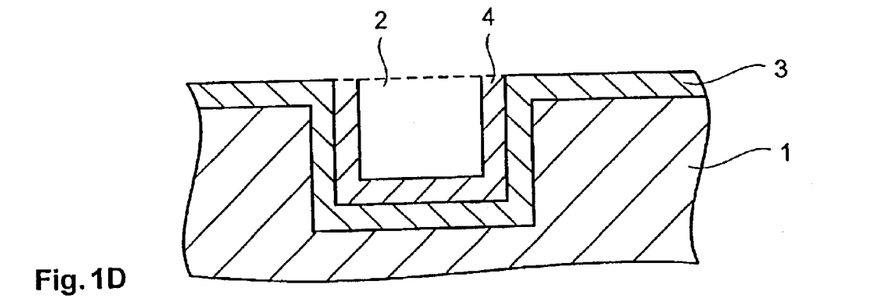
FIG. 1D is an example of a cross-sectional view of the via following selective removal of the preconditioning layer from the substrate.
Figure 5:
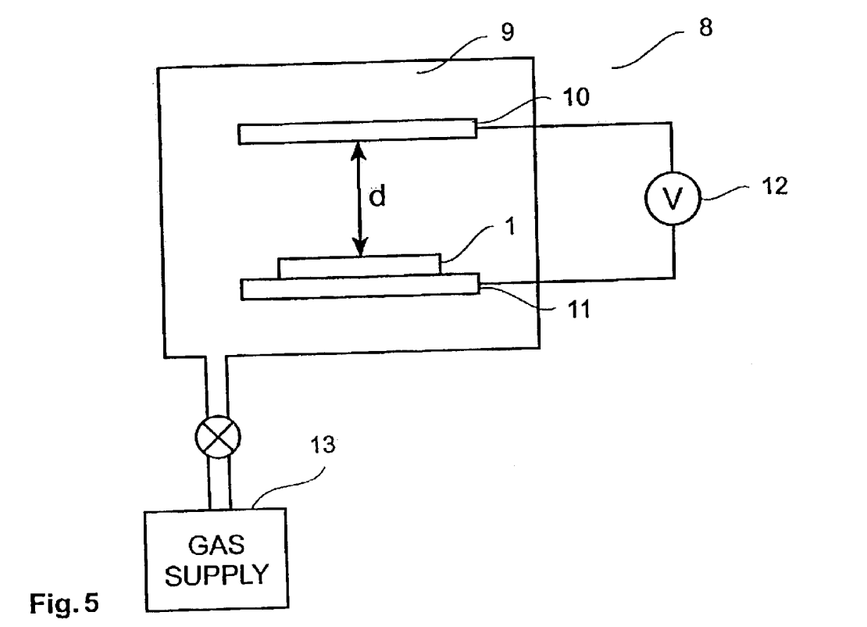
FIG. 5 is an example of a block diagram of a reactive ion etcher.

With reference now to FIG. 1D, in a particularly advantageous embodiment of the present invention, the preconditioning layer 4 is selectively removed from the substrate 1 by performing a plasma etch treatment. Turning to FIG. 5, the plasma etch treatment is performed in a reactive ion etcher 8. The reactive ion etcher 8 comprises a chamber 9 in which a first plane electrode 10 and a second plane electrode 11 are located in parallel orientation. The spacing between the first electrode 10 and the second electrode 11 is usually between 3 and 5 cm. A voltage supply 12 is connected to the first electrode 10 and the second electrode 11 for establishing an alternating current (AC) signal on a direct current (DC) potential difference between the first electrode 10 and the second electrode 11. The first electrode 10 is held by the voltage supply at a positive potential relative to the second electrode 11. In a particularly advantageous embodiment of the present invention, the AC signal is of an amplitude between ~200 V and ~500 V and the DC potential is around 200 V. A gas supply 13 is connected to the chamber 9. In operation, the gas supply 13 provides a controlled gas environment within the chamber 9. In a particularly advantageous embodiment of the present invention, the chamber 9 is filled with Argon at a pressure of ~50 to ~100 milliTorr. Other gases such as oxygen, for example, may also be used. In operation, the substrate 1 is placed on the second electrode 11. The voltage signals imposed between the first electrode 10 and the second electrode 11 by the voltage supply produce corresponding electric fields between the first electrode 10 and the second electrode 11.

Figure 6:
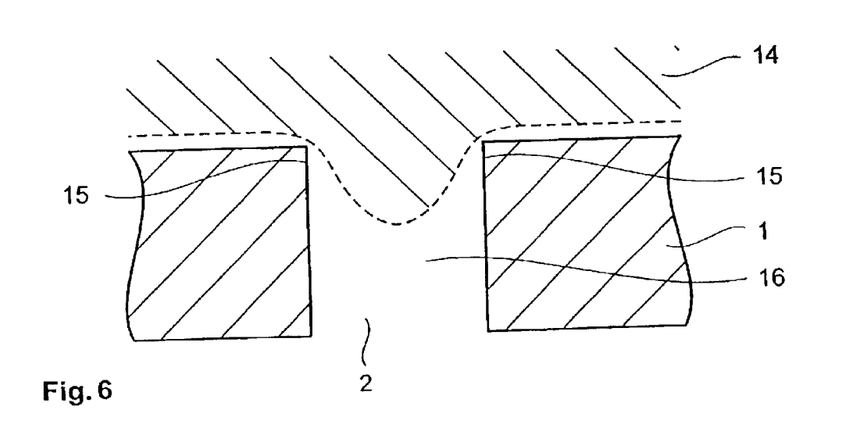
FIG. 6 is an example of an cross sectional view of a via showing penetration of plasma in to the via.
Figure 7:
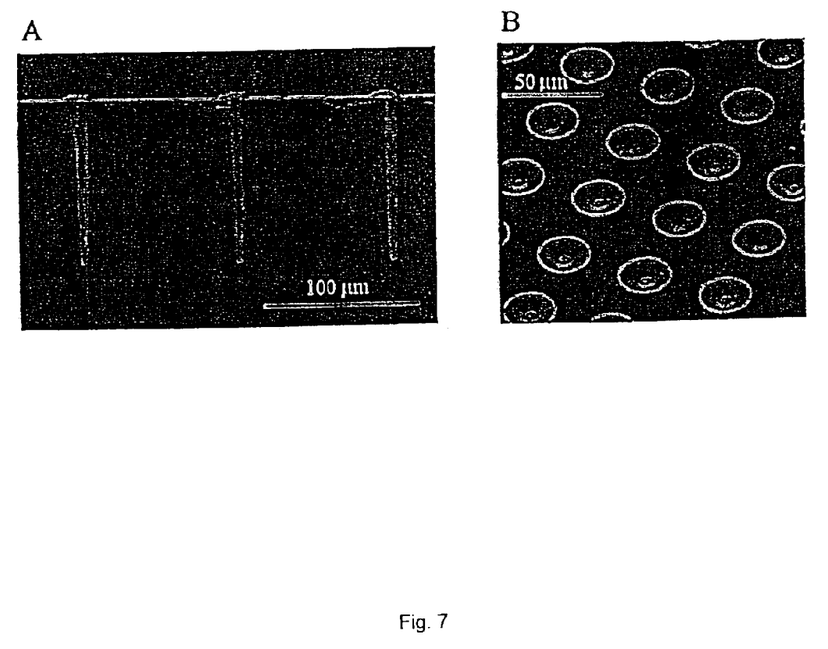
FIG. 7A is an example of a cross-sectional scanning electron microscope (SEM) image of vias in a Si wafer (side view) filled with NiP.
FIG. 7B is an example of an SEM image of vias in a Si wafer filled with NiP.
Figure 8:
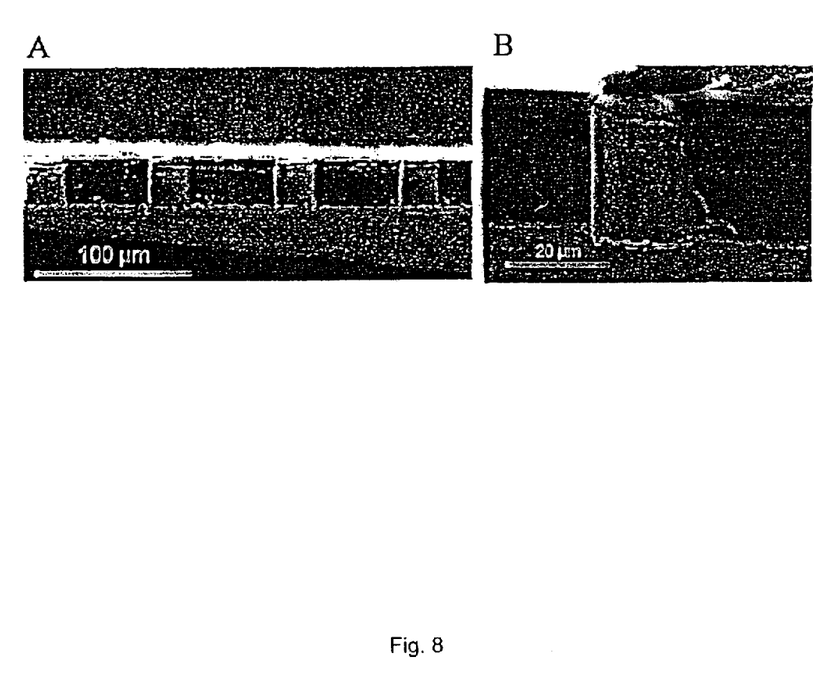
FIG. 8A is an example of a cross-sectional SEM image of a Si wafer which was thinned after filling of the vias with NiP to provide metallic trough-wafer interconnections.
FIG. 8B is an example of a cross-sectional SEM image of a single NiP through-wafer interconnection.

Referring now to FIG. 6, the gas in between the first electrode 10 and the second electrode 11 is ionized by the electric fields to produce a plasma 14 comprising positively and negatively charged gas ions and/or "radicals". A bombardment of the surface of the substrate 1 with these gas ions and/or radicals breaks off particles of the preconditioning layer 4 and from the substrate 1, thereby removing the preconditioning layer 4 from the substrate 1. The particles of the preconditioning layer 4 are broken off by a combination of physical and chemical action. As indicated earlier, in a particularly advantageous embodiment of the present invention, the etching is based on an isotropic argon plasma, but other types of plasma etching may be employed as well. The selective removal of the preconditioning layer 4 takes advantage from the relatively high aspect ratio of the via 2. Various parameters such as exposure time, bias power and gas pressure can be tuned to define the extent to which the plasma 14 penetrates the via 2, thus determining the depth to which the preconditioning layer 4 is removed within the via 2. Preferably, the plasma defining parameters are tuned such that only the surface of the substrate 1 and the entrance region 15 of the via 2 are affected by the plasma, whereas the interior of the via 16 remains untouched. The tuning of the plasma 14 is then such that it barely enters the via 2, thereby eliminating the preconditioning layer 4 only at the entrance to the via 2 together with the preconditioning layer 4 on the surface of the substrate 1. The pressure of the gas in the chamber, for example, provides a tunable parameter because the pressure of the gas directly affects the lifetime of the ions and radicals forming the plasma 14.

Figure 1E:
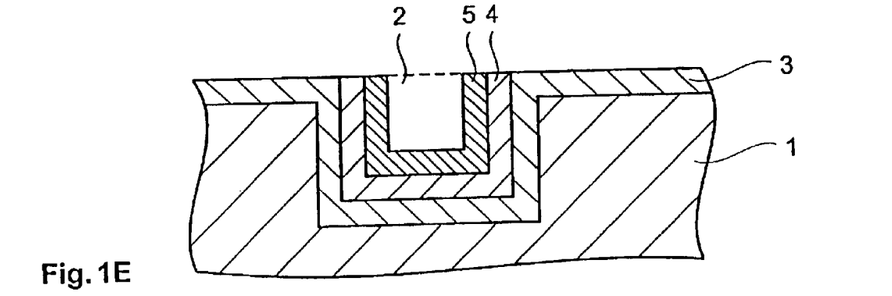
FIG. 1E is an example of a cross-sectional view of the via with immobilized catalysts for ELD applied.

Referring now to FIG. 1E, a layer of catalyst 5 is now deposited onto the preconditioning layer 4 remaining at the interior surface of the via 2. The catalyst layer 5 comprises particles for initiating ELD of a metal. As mentioned before, the particles of the catalyst layer interact specifically with the compounds forming the preconditioning layer 4 to ensure immobilization and a homogeneous coverage of the substrate 1. In a particularly advantageous embodiment of the present invention, the catalysts are Pd/Sn-based colloids. These colloids are preferred over other types of catalysts because they: provide a high catalytic activity for ELD of a variety of metals and metal alloys; can be deposited from solution; are commercially available; and, are highly chemically stable in acidic solutions. The deposition of these catalysts onto the substrate 1 from an acidic solution is simple and efficient: a ~10-s immersion into a 10% solution of Pd/Sn colloids in Hydrochloric acid can load the pretreated substrate 1 with a sufficient amount of catalysts. Typically, these catalysts are activated in an "acceleration" step to ensure a fast and homogeneous starting of the ELD procedure. Further details of such acceleration can be found in T. Osaka et al. *"A Study on Activation and Acceleration by Mixed $PdCl_2/SnCl_2$ Catalysts for Electroless Metal Deposition" J. Electrochem. Soc.* 1980, Vol. 127, 1021. In other embodiments of the present invention, different types of catalyst, such as molecular or colloidal Pd, Au, Pt or Co compounds, may be used, with an appropriate substrate pretreatment and deposition method, such as sputtering, CVD, or deposition from solution.

Figure 1F:
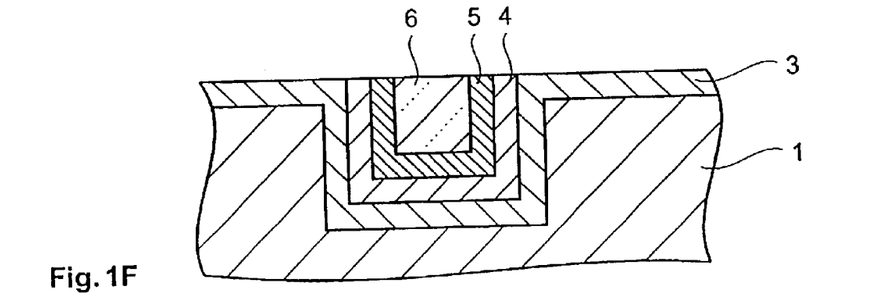
FIG. 1F is an example of a cross-sectional view of the via filled with a metal by ELD.

Referring now to FIG. 1F, ELD of a metal or metal alloy is then performed to fill the via 2 selectively with a conductive material 6 based on the portion of the catalyst layer 5 left in the via 2. In a particularly advantageous embodiment of the present invention, the conductive material comprises NiP. In other embodiments of the present invention, other metals including Au, Cu, Ag, Pd and various Ni and Co alloys may be used.

Figure 1G:
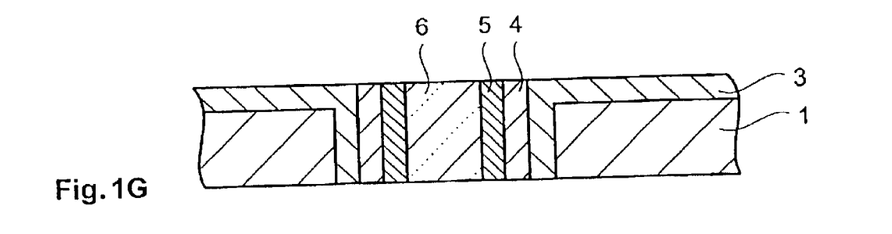
FIG. 1G is an example of a cross-sectional view of the via with the substrate thinned from the backside to create a through-wafer interconnection.

Referring to FIG. 1G, the substrate 1 is then thinned from the backside until the material 6 in the via 2 is reached to provide a through-wafer interconnection. Preferably, thinning of the substrate 1 is performed by polishing the backside.

EXAMPLE OF A PROCEDURE EMBODYING THE PRESENT INVENTION

In the following, an example for the via filling method embodying the present invention is described in detail. It will be clear to those skilled in the art, that the experimental details of the following example can be changed without departing from the scope of the present invention.

A substrate in the form of a Si wafer to support several arrays of vias (fabricated by DRIE) was first passivated by forming an isolation layer of oxide on its surface using thermal oxidation (T=1050° C.). The oxidized surface of the substrate was then cleaned and made hydrophilic by an $O_2$-plasma (oxygen pressure 0.1–0.5 mbar, load coil power ~100 W, exposure time ~1 min). Plasma hydrophilization of the surface of the substrate provides for fast and homogeneous wetting with the aqueous solutions used in the following processing steps.

A preconditioning step was performed by immersion of the freshly hydrophilized substrate in a solution containing 1% of N-(2-aminoethyl)-3-aminopropyltrimethoxysilane (hereinafter EDA-Si, bought from Gelest) in deionized water for 1 minute. A brief exposure of the grafting solution (containing the substrate) to ultrasound helped displace air bubbles in the vias which were trapped during the immersion step. Upon removal from the grafting solution, the substrate was rinsed with deionized water and dried in a stream of nitrogen.

The selective removal of the EDA-Si layer from the surface of the substrate and from the entrance to the via was achieved using an Ar plasma with an argon pressure of 40 milliTorr, 50 sccm, load coil power 100 W, and an exposure time of 3 seconds. EDA-Si was also removed from the backside of the substrate at this stage to avoid its unwanted metallization.

Seeding of a homogeneous catalytic layer onto the interior surface of the via was achieved by immersing the sample into an acidic solution of Pd/Sn colloids of Cataposit 44, Shipley, diluted 10% with $HCl/H_2O$ for 30 s. After removal, the sample was rinsed with deionized water and subsequently immersed into an "accelerator" solution containing $HBF_4$ prepared by diluting Fidelity #1019 1:9 (v/v) in water for 1 min. For both seeding and acceleration operations, a brief exposure to ultrasound proved helpful in providing a homogeneous delivery of reactants inside the vias. A rinsing with deionized water following removal from the accelerator solution yields a highly activated substrate to perform selective ELD of NiP, for example, in the vias. ELD of NiP was obtained by immersion of the activated sample into a commercial NiP plating bath of Enplate Ni-434 E, Imasa, prepared according to the recommendations of the supplier, operated at 88° C., a pH of 5.0, and with moderate stirring. Here, the evolution of $H_2$ bubbles promoted the circulation of the plating solution into the vias. Experiment indicates that the plating time for filling the vias entirely, however, varies strongly depending on the dimensions of the vias.

On removal of from the plating bath, rinsing with deionized water, and drying, the substrate was thinned from the backside by mechanical polishing using $Al_2O_3$ until the substrate reached a desired thickness where the plated metal inside the via is exposed at the backside of the substrate to provide a conductive interconnect. The SEM images shown in FIGS. 7A and B reveal the experimental result of having different closed, high-aspect-ratio vias in a Si substrate filled with NiP according to the above-mentioned example. Thinning the backside of the substrate resulted in the final metallic interconnection as demonstrated by the SEM images in FIGS. 8A and B.

In addition to the via filling techniques hereinbefore described, the present invention extends to a variety of alternative filling techniques. Examples of such techniques will be described hereinafter.

Figure 2A:
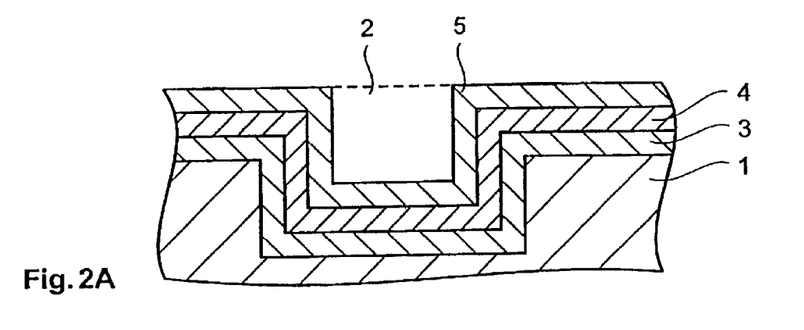
FIG. 2A is an example of a cross-sectional view of a via which has been activated with a layer of catalysts for ELD.
Figure 2B:
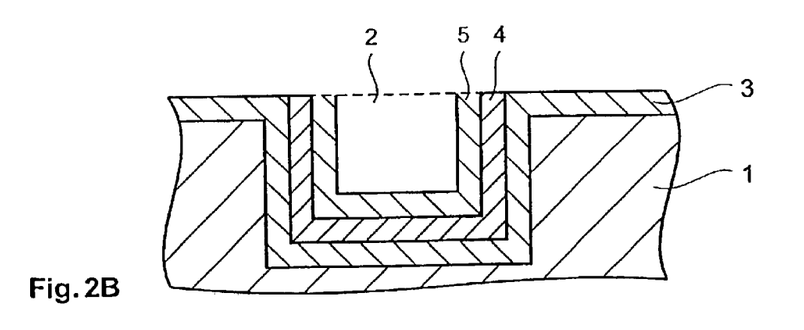
FIG. 2B is an example of a cross-sectional view of the via with the preconditioning layer and the catalyst layer removed selectively from the surface of the substrate.

With reference to FIG. 2A, in another embodiment of the present invention, the preconditioned substrate 1 is first activated entirely with the catalyst layer 5. Referring to FIG. 2B, a plasma etch then removes both the preconditioning layer 4 and the catalyst layer 5 from the outer surface of the substrate 1. The next steps of this procedure are then similar to those hereinbefore described with reference to FIG. 1.

The plasma treatment may also be performed after an initial ELD plating step in which a relatively thin metal layer of typically a few nm is deposited over the substrate 1. The metal layer on the surface of the substrate 1 and at the entrance of the via 2 are removed together with the catalyst layer 5 and the preconditioning layer 4 during the plasma etch step. The metal layer remaining untouched inside the via then acts as the catalyst to initiate ELD again and fill up the via 2 by plating.

Figure 3A:
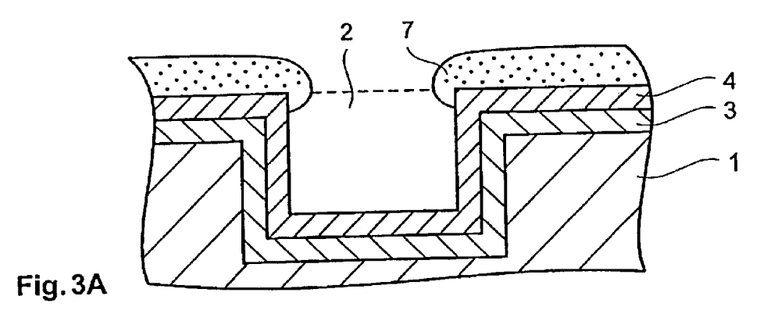
FIG. 3A is an example of a cross-sectional view of a via with the surrounding substrate covered by a passivation layer.
Figure 3B:
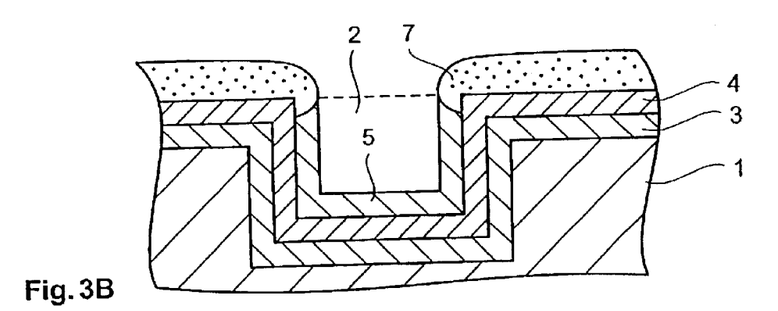
FIG. 3B is an example of a cross-sectional view of the via with catalysts for ELD immobilized selectively onto those exposed parts of the interior surface of the via.

With reference to FIG. 3A, in another example of the present invention, the surface of the substrate and the entrance of the via are coated selectively with a passivation layer 7. The passivation layer 7 does not however extend into the via. In this case, the passivation layer 7 prevents the preconditioning layer 4 from binding catalysts, thus blocking the coated surface from being activated for ELD. Examples of materials from which the passivation layer 7 may be formed are silicon dioxide and silicon nitride. Layers made of these compounds may be applied by various techniques including sputtering or evaporation at an incline relative to the surface of the substrate. Here, the angle of deposition of the passivation layer 7 controls the depth to which the passivation layer 7 extends into the via 2. The angle necessary to obtain highly selective coverage of the substrate depends on the dimensions of the via 2. Rotating the sample during the evaporation, however, is desirable to ensure homogenous deposition of the passivation layer 7. As mentioned earlier, the passivation layer 7 prevents the binding of the catalysts to the preconditioning layer 4 on the surface of the substrate 1 and at the entrance of via 2. Consequently, with reference to FIG. 3B, deposition of the catalytic layer can thus be confined to the regions in the via 2 left uncovered by the passivating layer 7. ELD of the conductive material 6 can then occur selectively within the activated via 2.

Figure 4:
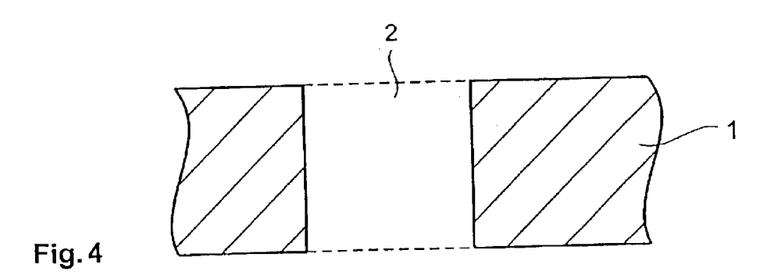
FIG. 4 is an example of a cross-sectional view of a via, etched through the substrate.

With reference to FIG. 4, the via 2 can be etched through the entire thickness of the substrate 1. The procedure for filling such a via 2 with conductive material 6 uses the techniques described hereinbefore with reference to FIGS. 1, 2 and 3. Both sides of the substrate 1 can be treated equally using the procedures herein before described. In this case however, no thinning of the substrate 1 at the end of the procedure is required.

In other embodiments of the present invention, the deposition of the conductive material is selectively disabled from coating surfaces of the substrate 1 outside the via 2 by wet processing in which the substrate 1 is immersed in a processing solution and surface tension is employed to prevent ingress of the processing solution into the via 2. Aqueous processing solutions have surface tension properties which are particularly suitable for such wet processing. However, it will be appreciated that other solutions may be also be employed. In one such embodiment of the present invention, the substrate 1 is immersed in an alkaline solution such as Potassium Hydroxide in water after deposition of the preconditioning layer 4. The alkaline solution etches away the preconditioning layer 4 from the surface of the substrate. However, surface tension prevents the alkaline solution from penetrating the interior of the via 2. The preconditioning layer 4 within the via 2 therefore remains unaffected. In another embodiment of the present invention, the substrate 1 is immersed in an alkaline solution such as Potassium Hydroxide in water after deposition of the catalyst layer 5. The alkaline solution causes the catalyst layer to be released from the surface of the substrate 1. Again however, surface tension prevents the alkaline solution from penetrating the interior of the via 2. The catalyst layer 5 within the via 2 therefore remains bound to the preconditioning layer 4. In yet another embodiment of the present invention, the substrate 1 is immersed in an oxidizing agent dissolved in water such as Hydrogen Peroxide after deposition of the preconditioning layer 4. The oxidizing agent oxidizes and removes the preconditioning layer 4 from the surface of the substrate 1. However, surface tension prevents the oxidizing agent from penetrating the interior of the via 2. The preconditioning layer 4 within the via 2 therefore remains unaffected. In another embodiment of the present invention, the substrate 1 is immersed in an oxidizing agent dissolved in water such as Hydrogen Peroxide after deposition of the catalyst layer 5. The oxidizing agent oxidizes and disables the catalyst layer 5 from the surface of the substrate 1. Again however, surface tension prevents the oxidizing agent from penetrating the interior of the via 2. The catalyst layer 5 within the via 2 therefore remains unaffected.

It will be appreciated that the present invention extends to a substrate processed according to a method as hereinbefore described. Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

The present invention can be realized in hardware, software, or a combination of hardware and software. A visualization tool according to the present invention can be realized in a centralized fashion in one computer system, or in a distributed fashion where different elements are spread across several interconnected computer systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A method for forming an interconnection in a substrate, the method comprising:

forming a via in the substrate;

depositing a preconditioning layer on the substrate;

binding a catalyst layer to the preconditioning layer;
      depositing a conductive material on the catalyst layer by electro-less deposition to fill the via with the conductive material; and, selectively disabling deposition of the conductive material from coating surfaces of the substrate outside the via.

2. A method as claimed in claim 1, wherein the step of selective disabling comprises selectively removing the preconditioning layer from surfaces of the substrate outside the via prior to binding of the catalyst layer.

3. A method as claimed in claim 2, wherein the step of selective removing comprises selectively etching the preconditioning layer.

4. A method as claimed in claim 1, wherein the step of selective disabling comprises selectively removing the preconditioning layer and the catalyst layer from surfaces of the substrate outside the via prior to deposition of the conductive material.

5. A method as claimed in claim 4, wherein the step of selectively removing comprises selectively etching the catalyst layer and the preconditioning layer.

6. A method as claimed in claim 3 or claim 5, wherein the selective etching comprises plasma etching in a gas environment.

7. A method as claimed in claim 6, wherein the plasma etching comprises controlling depth of penetration of a plasma into the via based on the pressure of the gas environment.

8. A method as claimed in claim 7, wherein the gas is Argon.

9. A method as claimed in claim 8, wherein the pressure of the gas environment is in the range of about 50 to 100 milliTorr.

10. A method as claimed in claim 1, wherein the step of selective disabling comprises selectively depositing a passivation layer on the preconditioning layer coating surfaces of the substrate outside the via to prevent the catalyst layer from binding to preconditioning layer coating surfaces of the substrate outside the via.

11. A method as claimed in claim 1, wherein, the step of selective disabling comprises:

depositing an initiating layer of the conductive material on the catalyst layer; and selectively removing the preconditioning layer, the catalyst layer, and the initiating layer from surfaces of the substrate outside the via prior to deposition of the conductive material.

12. A method as claimed in claim 11, wherein the selectively removing comprises selectively etching the initiating layer, the catalyst layer, and the preconditioning layer.

13. A method as claimed in claim 1, further comprising forming an isolation layer on the substrate prior to deposition of the preconditioning layer.

14. A method as claimed in claim 13, wherein the isolation comprises an oxide of the substrate.

15. A method as claimed in claim 1, comprising hydrophilizing the substrate prior to deposition of the preconditioning layer.

16. A method as claimed in claim 15, wherein the depositing of the preconditioning layer comprises immersing the substrate in a grafting solution of material for forming the catalyst layer.

17. A method as claimed in claim 16, wherein the depositing of the preconditioning layer comprises applying ultrasound to the grafting solution.

18. A method as claimed in claim 16, wherein the binding of the catalyst layer comprises immersing the substrate in an acidic solution of material for forming the catalyst layer.

19. A method as claimed in claim 18, wherein the binding of the catalyst layer comprises applying ultrasound to the acidic solution.

20. A method as claimed in claim 1, wherein the selective disabling comprises immersing the substrate in a processing solution and employing surface tension to prevent ingress of a processing solution into the via.

21. A method as claimed in claim 20, wherein the processing solution comprises an aqueous solution.

22. A method as claimed in claim 21, wherein the aqueous solution comprises an alkaline solution.

23. A method as claimed in claim 21, wherein the aqueous solution comprises an oxidizing agent.

24. A method as claimed in claim 20, wherein the immersing of the substrate in the processing solution is performed after deposition of the preconditioning layer.

25. A method as claimed in claim 20, wherein the immersing of the substrate in the processing solution is performed after deposition of the catalyst layer.

26. A substrate processed according to a method as claimed in claim 1.

27. An apparatus comprising means for forming an interconnection in a substrate, the means for forming an interconnection comprising:

means for forming a via in the substrate;

means for depositing a preconditioning layer on the substrate;

means for binding a catalyst layer to the preconditioning layer;

means for depositing a conductive material on the catalyst layer by electro-less deposition to fill the via with the conductive material; and, means for selectively disabling deposition of the conductive material from coating surfaces of the substrate outside the via.

28. A computer apparatus comprising means for enabling the method of claim 1.

29. An article of manufacture comprising a computer usable medium having computer readable program code means embodied therein for causing interconnection in a substrate, the computer readable program code means in said article of manufacture comprising computer readable program code means for causing a computer to effect the steps of claim 1.

30. A program storage device readable by machine, tangibly embodying a program of instructions executable by the machine to perform method steps for enabling interconnection in a substrate, said method steps comprising the steps of claim 1.

31. A computer program product comprising a computer usable medium having computer readable program code means embodied therein for causing formation of an interconnection in a substrate, the computer readable program code means in said computer program product comprising computer readable program code means for causing a computer to effect the functions of claim 1.

* * * * *